United States Patent
Touchais et al.

(10) Patent No.: US 7,680,209 B2
(45) Date of Patent: Mar. 16, 2010

(54) METHOD AND DEVICE FOR TRAINING AN RF AMPLIFIER LINEARIZATION DEVICE, AND MOBILE TERMINAL INCORPORATING SAME

(75) Inventors: Sandrine Touchais, Orsay (FR); Xavier Checoury, Paris (FR)

(73) Assignee: EADS Telecom, Montigny le Bretonneaux (FR)

(*) Notice: Subject to any disclaimer, the term of this patent is extended or adjusted under 35 U.S.C. 154(b) by 1097 days.

(21) Appl. No.: 10/533,861

(22) PCT Filed: Oct. 28, 2003

(86) PCT No.: PCT/FR03/03204

§ 371 (c)(1),
(2), (4) Date: May 5, 2005

(87) PCT Pub. No.: WO2004/045066

PCT Pub. Date: May 27, 2004

(65) Prior Publication Data

US 2006/0013334 A1    Jan. 19, 2006

(30) Foreign Application Priority Data

Nov. 5, 2002    (FR) ................... 02 13825

(51) Int. Cl.
*H04K 1/02* (2006.01)
*H04L 27/00* (2006.01)
(52) U.S. Cl. ................ 375/296; 375/295; 375/297; 375/146

(58) Field of Classification Search ............... 375/295, 375/296, 297, 146
See application file for complete search history.

(56) References Cited

U.S. PATENT DOCUMENTS

| | | | | |
|---|---|---|---|---|
| 4,291,277 A | * | 9/1981 | Davis et al. | 330/149 |
| 4,700,151 A | * | 10/1987 | Nagata | 332/123 |
| 5,049,832 A | * | 9/1991 | Cavers | 330/149 |
| 5,148,448 A | * | 9/1992 | Karam et al. | 375/298 |
| 5,507,014 A | * | 4/1996 | Wray et al. | 455/114.3 |
| 5,559,807 A | * | 9/1996 | van den Heuvel et al. | 370/347 |
| 5,699,383 A | * | 12/1997 | Ichiyoshi | 375/297 |
| 5,732,333 A | * | 3/1998 | Cox et al. | 455/126 |
| 5,748,678 A | * | 5/1998 | Valentine et al. | 375/297 |

(Continued)

FOREIGN PATENT DOCUMENTS

GB    2 321 574    7/1998

OTHER PUBLICATIONS

ISR, for PCT/FRO3/03204, issued on Mar. 11, 2004.

*Primary Examiner*—Temesghen Ghebretinsae
(74) *Attorney, Agent, or Firm*—McCracken & Frank LLP

(57) ABSTRACT a method whereby a linearization training sequence is designed to be transmitted by means of a radiofrequency transmitter incorporated in a mobile terminal or a base station of a radiocommunication system comprising a fixed network. The sequence is adapted for transmitting bursts in accordance with a specific frame structure. Besides, the sequence is included in a sequence of symbols further designed to enable the transmission chain parameters to be adjusted.

16 Claims, 2 Drawing Sheets

U.S. PATENT DOCUMENTS

| | | | | |
|---|---|---|---|---|
| 5,760,646 A * | 6/1998 | Belcher et al. | 330/149 |
| 5,867,065 A * | 2/1999 | Leyendecker | 330/149 |
| 5,892,397 A * | 4/1999 | Belcher et al. | 330/149 |
| 5,913,172 A * | 6/1999 | McCabe et al. | 455/503 |
| 5,920,808 A * | 7/1999 | Jones et al. | 455/127.1 |
| 5,923,712 A * | 7/1999 | Leyendecker et al. | 375/297 |
| 5,929,703 A * | 7/1999 | Sehier et al. | 330/149 |
| 5,959,499 A * | 9/1999 | Khan et al. | 330/149 |
| 5,959,500 A * | 9/1999 | Garrido | 330/151 |
| 6,043,707 A * | 3/2000 | Budnik | 330/10 |
| 6,075,411 A * | 6/2000 | Briffa et al. | 330/149 |
| 6,141,390 A * | 10/2000 | Cova | 375/297 |
| 6,320,463 B1 * | 11/2001 | Leva et al. | 330/149 |
| 6,320,919 B1 * | 11/2001 | Khayrallah et al. | 375/347 |
| 6,369,648 B1 * | 4/2002 | Kirkman | 330/43 |
| 6,396,350 B2 * | 5/2002 | Nam | 330/297 |
| 6,674,808 B1 * | 1/2004 | Griph et al. | 375/285 |
| 6,680,649 B2 * | 1/2004 | Rydin | 330/149 |
| 6,731,168 B2 * | 5/2004 | Hedberg et al. | 330/149 |
| 6,741,662 B1 * | 5/2004 | Francos et al. | 375/297 |
| 6,771,708 B1 * | 8/2004 | Suga et al. | 375/278 |
| 6,853,246 B2 * | 2/2005 | Bauder et al. | 330/149 |
| 6,885,241 B2 * | 4/2005 | Huang et al. | 330/149 |
| 6,891,902 B2 * | 5/2005 | Talwar et al. | 375/296 |
| 6,928,122 B2 * | 8/2005 | Opas et al. | 375/296 |
| 6,931,080 B2 * | 8/2005 | Giardina et al. | 375/296 |
| 6,985,704 B2 * | 1/2006 | Yang et al. | 455/126 |
| 7,003,051 B2 * | 2/2006 | Francos et al. | 375/296 |
| 7,016,431 B2 * | 3/2006 | Schrader et al. | 375/297 |
| 7,062,233 B2 * | 6/2006 | Huttunen | 455/114.3 |
| 7,085,330 B1 * | 8/2006 | Shirali | 375/296 |
| 7,099,399 B2 * | 8/2006 | McCallister | 375/269 |
| 7,289,773 B2 * | 10/2007 | Braithwaite | 455/91 |
| 7,295,815 B1 * | 11/2007 | Wright et al. | 455/91 |
| 7,312,656 B2 * | 12/2007 | Saed | 330/149 |
| 7,593,477 B2 * | 9/2009 | Touchais et al. | 375/296 |
| 2002/0016154 A1 * | 2/2002 | Huttunen | 455/63 |
| 2002/0171485 A1 * | 11/2002 | Cova | 330/149 |
| 2002/0186796 A1 * | 12/2002 | McFarland et al. | 375/341 |
| 2003/0031270 A1 * | 2/2003 | Giardina et al. | 375/296 |
| 2003/0035494 A1 * | 2/2003 | Bauder et al. | 375/296 |
| 2003/0063686 A1 * | 4/2003 | Giardina et al. | 375/296 |
| 2003/0072388 A1 * | 4/2003 | Francos et al. | 375/296 |
| 2003/0146787 A1 * | 8/2003 | Hedberg et al. | 330/149 |
| 2003/0156657 A1 * | 8/2003 | Schrader et al. | 375/295 |
| 2003/0156658 A1 * | 8/2003 | Dartois | 375/297 |
| 2003/0179830 A1 * | 9/2003 | Eidson et al. | 375/296 |
| 2003/0184374 A1 * | 10/2003 | Huang et al. | 330/149 |
| 2003/0197558 A1 * | 10/2003 | Bauder et al. | 330/149 |
| 2003/0207680 A1 * | 11/2003 | Yang et al. | 455/341 |
| 2004/0028146 A1 * | 2/2004 | Winkler | 375/260 |
| 2004/0057533 A1 * | 3/2004 | Kermalli | 375/296 |
| 2005/0032472 A1 * | 2/2005 | Jiang et al. | 455/13.4 |
| 2005/0163250 A1 * | 7/2005 | McCallister | 375/296 |
| 2005/0163251 A1 * | 7/2005 | McCallister | 375/296 |
| 2005/0169411 A1 * | 8/2005 | Kroeger | 375/350 |
| 2005/0231279 A1 * | 10/2005 | Moffatt et al. | 330/149 |
| 2006/0008028 A1 * | 1/2006 | Maltsev et al. | 375/297 |
| 2006/0039498 A1 * | 2/2006 | de Figueiredo et al. | 375/297 |
| 2006/0247898 A1 * | 11/2006 | Cha | 702/188 |

\* cited by examiner

METHOD AND DEVICE FOR TRAINING AN RF AMPLIFIER LINEARIZATION DEVICE, AND MOBILE TERMINAL INCORPORATING SAME

BACKGROUND OF THE INVENTION

1. Technical Field

The present invention relates to the linearization of radiofrequency (RF) power amplifiers. It finds applications, in particular, in the RF transmitters of the mobile terminals of digital radiocommunication systems. It may also be applied in the RF transmitters of base stations in particular during the first startup of such a station.

2. Related Art

In current digital radiocommunication systems, one seeks to send information with a maximum throughput in a given RF frequency band which is assigned to a transmission channel (hereinbelow radio channel). To do this, the modulations that have been used for a few years comprise a phase or frequency modulation component and an amplitude modulation component.

Moreover, radio channels coexist in a determined frequency band allotted to the system. Each radio channel is subdivided into logical channels by time division. In each time interval (or time slot), a group of symbols called a burst or packet is transmitted.

It is necessary to take care that, at each instant, the power level transmitted in each radio channel does not jam the communications in an adjacent radio channel. Thus, specifications prescribe that the power level of an RF signal transmitted in a determined radio channel be, in an adjacent radio channel, less for example by 60 dB (decibels), than the power level of the RF signal transmitted in said determined radio channel.

It therefore turns out to be necessary that the spectrum of the signal to be transmitted, which results in particular from the type of the modulation employed and the binary throughput, not be deformed by the RF transmitter. In particular, it is necessary that the RF transmitter exhibit a characteristic of output power as a function of input power, which is linear.

However, the radiofrequency power amplifier (hereinafter RF amplifier) present in the RF transmitter has a characteristic that is linear at low output power but nonlinear as soon as the power exceeds a certain threshold. It is also known that the efficiency of the RF amplifier is all the better when working in a zone close to saturation, that is to say in the nonlinear regime. Thus, the need for linearity and the need for high efficiency (to save on battery charge) compel the use of linearization techniques to correct the nonlinearities of the RF amplifier. Two of the techniques most commonly employed are baseband adaptive predistortion and the baseband Cartesian loop.

In the Cartesian loop technique, the signal to be transmitted is generated in baseband in the I and Q format. Additionally, a coupler followed by a demodulator makes it possible to tap off a part of the RF signal transmitted and to transpose it to baseband (downconversion), in the I and Q format. This baseband signal is compared with the baseband signal to be transmitted. An error signal resulting from this comparison drives a modulator, which provides for the transposition to the radiofrequency domain (upconversion). The output signal from the modulator is amplified by an RF amplifier which delivers the RF signal transmitted.

In the baseband adaptive predistortion technique, the signal to be transmitted is generated in baseband, in the I and Q format, and predistorted via a predistortion device. Then, this signal is transposed to the RF domain by virtue of an RF modulator. Next, it is amplified in an RF amplifier. A coupler followed by an RF demodulator make it possible to tap off a part of the RF signal transmitted and to transpose it to baseband, in the I, Q format. This baseband demodulated signal is digitized and compared with the baseband signal to be transmitted. An adaptation of the predistortion coefficients, carried out during a phase of training of the predistortion device, allows the demodulated I and Q format signal to be made to converge to the I and Q format signal to be transmitted.

In both techniques, a part of the signal transmitted is tapped off at the output of the RF amplifier so as to compare it with the signal to be transmitted. As a result, linearity is not obtained immediately but only after a certain time, required for the convergence of the linearization device. The training of the linearization device requires the sending of a particular sequence of data or training sequence. This remark applies admittedly more to adaptive predistortion than to the Cartesian loop, even if the latter requires, in order to ensure its stability, initial adjustments of phase and of amplitude levels akin to training.

The training procedure disclosed in WO 94/10765 thus relies on the transmission by the transmitters of the system of particular sequences, so-called linearization training sequences, during linearization training phases. More particularly, training sequences are transmitted in an isolated manner in time intervals forming a particular logical channel of the radio channels, which is dedicated solely to linearization. However, this procedure has several drawbacks. Firstly, it requires prior synchronisation of all the transmitters so that the latter transmit their respective linearization training sequence in the logical channel dedicated to linearization. Moreover, no sending of data can occur in the time intervals of this logical channel. Furthermore, at the start of each transmission or in the event of a change of radio channel, the transmitter is compelled to wait for the next time interval of the logical channel dedicated to linearization, unless the system is made considerably more complex. This is why the temporal spacing between two time intervals of said logical channel cannot exceed a second, so as to guarantee a certain quality of service (QoS). This technique is therefore very prejudicial to the spectral efficiency of the radiocommunication system.

In a general manner, there exist radiocommunication systems whose frame structure is not adapted to the sending of a training sequence, for example when no specific time interval has been provided for this purpose when defining the frame structure.

BRIEF DESCRIPTION OF THE INVENTION

A first aspect of the invention relates to a method of training a device for linearizing a radiofrequency amplifier which is included within a radiofrequency transmitter of a first equipment of a first equipment of a radiocommunication system comprising a fixed network and mobile terminals, which transmitter is adapted for transmitting bursts according to a determined frame structure, each burst comprising symbols belonging to a determined alphabet of symbols. Embodiments of the method comprise the steps of:

a) generating a linearization training sequence comprising a determined number N of symbols, where N is a determined integer;

b) transmitting the linearization training sequence by means of the radiofrequency transmitter in at least certain of the bursts transmitted by the latter;

c) comparing the linearization training sequence transmitted with the linearization training sequence generated so as to train the linearization device.

In one embodiment, in step b), the linearization training sequence is included in a sequence of symbols that is further designed to allow the adjusting of parameters of the transmission chain between said first equipment and a second equipment of the radiocommunication system with which said first equipment communicates.

The expression transmission chain is understood to mean the set of components which participate in a bidirectional communication between a first and a second equipments, typically a mobile terminal and the base station with which it communicates.

Preferably, the sequence of symbols that is designed to allow the adjusting of parameters is a sequence of symbols that is designed to allow the dynamic control of the gain of a variable-gain amplifier of a radiofrequency receiver of a second equipment of the radiocommunication system with which the first equipment communicates.

Stated otherwise, the training sequence is transmitted in step b) inside a time interval reserved within the frame structure for the transmission of an AGC (Automatic Gain Control) sequence, and at the same time it ensures the role of such an AGC sequence.

Thus, for the transmission of the training sequence, use is made of the transmission time of a sequence of symbols that is necessary for other purposes, in this instance an AGC sequence transmitted so as to allow the dynamic control of the transmission power of the mobile terminal at reception.

In one embodiment, the value of the symbols of the AGC sequence is not subject to any constraint (the AGC sequence must simply be known to the fixed network). There is therefore complete freedom to choose the symbols of the sequence, or at least some of the symbols of the sequence, in such a way that these symbols form a satisfactory training sequence.

In further embodiments, the recurrence of the AGC sequence is adapted to the training requirements of the RF amplifier linearization device. Specifically, the AGC sequence is in general transmitted at the start of a frame, then upon a change of logical channel, upon a change of RF frequency and/or upon a change of power rating. Now, it is substantially at those moments also that there is a need for the linearization training sequence to be transmitted.

A second aspect of the invention relates to a device for training a device for linearizing a radiofrequency amplifier which is included within a radiofrequency transmitter of a first equipment of a radiocommunication system, which transmitter is adapted for transmitting bursts according to a determined frame structure, each burst comprising symbols belonging to a determined alphabet of symbols. The device comprises:

a) means for generating a linearization training sequence comprising a determined number N of symbols, where N is a determined integer;
b) means for transmitting the linearization training sequence by means of the transmitter in at least certain of the bursts transmitted by the latter;
c) means for comparing the linearization training sequence transmitted with the linearization training sequence generated so as to train the linearization device.

Advantageously, the linearization training sequence is included in a sequence of symbols that is further designed to allow the adjusting of parameters of the transmission chain between said first equipment and a second equipment of the radiocommunication system with which said first equipment communicates.

Preferably, the sequence of symbols that is designed to allow the adjusting of parameters is a sequence of symbols that is designed to allow the dynamic control of the gain of a variable-gain amplifier of a radiofrequency receiver of a second item of equipment of the radiocommunication system with which the first equipment communicates.

Stated otherwise, said the for transmitting are adapted to transmit the training sequence inside a time interval reserved within the frame structure for the transmission of an AGC sequence, and the training sequence at the same time ensures the role of such an AGC sequence.

A third aspect of the invention relates to a mobile terminal of a radiocommunication system, comprising a radiofrequency transmitter having a radiofrequency amplifier and a device for linearizing the radiofrequency amplifier, and which further comprises a device for training the linearization device according to the second aspect.

A fourth aspect of the invention relates to a base station of a radiocommunication system comprising a radiofrequency transmitter having a radiofrequency amplifier and a device for linearizing the radiofrequency amplifier, and which further comprises a device for training the linearization device according to the third aspect.

DESCRIPTION OF PREFERRED EMBODIMENTS.

Figure 1:
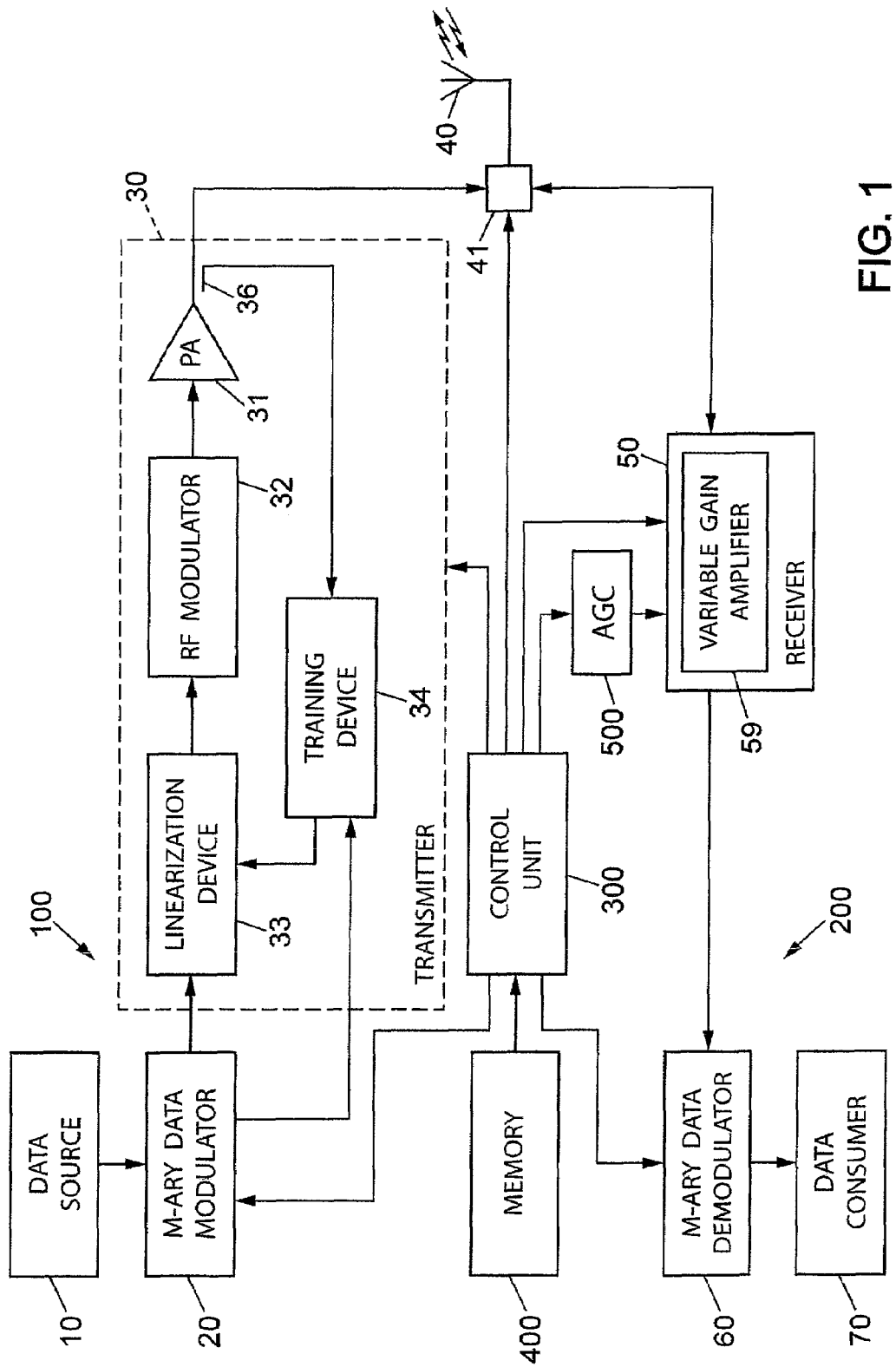
FIG. 1 is a schematic diagram of an exemplary mobile terminal according to the invention.

Represented diagrammatically in FIG. 1 are the means of an exemplary mobile terminal according to the invention. Such a mobile terminal belongs for example to a radiocommunication system which additionally comprises a fixed network having base stations.

The terminal comprises a transmit chain 100, a receive chain 200, a control unit 300, a permanent memory 400, as well as an automatic gain control device 500 (AGC) associated with an RF receiver of the receive chain 200.

The transmit chain 100 comprises a useful-data source 10, for example a speech coder delivering voice-coding data. The source 10 is coupled to an M-ary data modulator 20 which provides for the baseband modulation of the data to be transmitted according to a modulation with M distinct states, where M is a determined integer. The binary data which it receives from the source 10 are translated by the modulator 20 into symbols belonging to an M-ary alphabet, that is to say comprising M distinct signals. The output of modulator 20 is coupled to the input of a radiofrequency transmitter 30. On the basis of the string of symbols received, the transmitter 30 produces an RF signal suitable for radio transmission via an antenna or a cable. The output of the transmitter 30 is coupled to a transmit/receive antenna 40 via a switch 41. Thus the RF signal produced by the transmitter is transmitted on the radio channel associated with the transmitter.

The receive chain 200 comprises a radiofrequency receiver 50 which is coupled to the antenna 40 via the switch 41, so as to receive an RF signal. The receiver 50 provides for the transposition from the RF domain to the baseband (downconversion). The receive chain 200 also comprises an M-ary data demodulator 60, coupled to the receiver 50. The data demodulator 60 provides in baseband for the demodulation of the data of the signal received, that is to say the operation inverse to that provided by the modulator 20. Finally, the receive chain 200 comprises a data consumer device 70, such as a speech decoder, which is coupled to the demodulator 60. This device receives as input the binary data delivered by the demodulator 60.

The unit 300 is for example a microprocessor or a microcontroller which provides for the management of a mobile terminal. In particular, it controls the data modulator 20, the data demodulator 60, the transmitter 30 and the switch 41. It also generates signaling data which are supplied to the modulator 20 so as to be transmitted in appropriate signaling logical channels. Conversely, the unit 300 receives from the data demodulator 60 signaling data dispatched by the fixed network in appropriate signaling logical channels, in particular synchronization information and operating commands.

The memory 400 is for example a ROM ("Read Only Memory"), EPROM ("Electrically Programmable ROM") or Flash-EPROM memory, in which are stored data which are used for the operation of the mobile terminal. These data comprise in particular a linearization training sequence to which we shall return later.

An exemplary embodiment of the transmitter 30 will now be described. In this example, the transmitter 30 comprises a radiofrequency power amplifier 31, a radiofrequency modulator 32 which provides for the transposition from baseband to the radiofrequency domain (upconversion), a linearization device 33, a training module 34 associated with the linearization device.

The output of the power amplifier 31 delivers the RF signal to be transmitted. This is why this output is coupled to the antenna 40 via the switch 41. The input of the power amplifier 31 receives a radiofrequency signal delivered by the output of the radiofrequency modulator 32. The input of the latter is coupled to the output of the data modulator 20 so as to receive the string of symbols forming the baseband signal to be transmitted, through the linearization device 33. The latter comprises for example a predistortion device comprising a pallet ("look-up table") which translates each value of the signal to be transmitted into a predistorted value. As a variant or as a supplement, the device 33 can also comprise means of amplitude slaving of the output signal from the transmitter 30.

The training module 34 carries out the training of the linearization device 33 as a function of an input signal which reflects the RF signal delivered by the output of the power amplifier 31. For this purpose, the module 34 receives a part of this RF signal, which part is tapped off at the output of the power amplifier 31 by means of a coupler 36. As needed, the module 34 provides for the baseband return of the RF signal thus tapped off. Although being represented entirely inside the transmitter 30, the module 34 can, at least in part, be implemented by means belonging to the control unit 300, in particular software means.

Finally, the automatic gain control device 500 makes it possible for the control unit 300 to dynamically vary the gain of the variable gain amplifier 59 of the RF receiver 50, as a function of information which is received from the base station with which the terminal is communicating, according to a method known per se. By virtue of this method, the base station transmits at determined instants a determined sequence, called the AGC sequence. This sequence is known to and recognizable by the mobile terminal. It allows the latter to measure the power of the signal received from the base station and to deduce therefrom a control for the gain of the amplifier 59. This method is implemented in the mobile terminal by the device 500 under the control of the unit 300.

The principle of such a method will be described hereinbelow with reference to the diagram of FIG. 4.

The manner of operation of the mobile terminal during a phase of training, by the device 34, of the linearization device 33 will now be described. Although it will not be mentioned each time in what follows, it is of course understood that the terms "training phase" and the terms "training sequence" refer to the training of the linearization device 33 performed by the training device 34 under the control of the unit 300.

The method of training the device 33 comprises a step consisting in generating a training sequence comprising a determined number N of symbols, where N is an integer. This step is carried out by the data modulator 20 under the control of the control unit 300. For this purpose, the unit 300 reads a corresponding sequence of bits in the memory 400.

Next, still under the control of the unit 300, the training sequence is transmitted by means of the transmitter 30 in at least certain of the bursts transmitted by the latter, according to the frame structure of the system.

The training device 34 thus obtains the training sequence transmitted and compares it with the training sequence generated, and performs actions accordingly such as adaptations of predistortion coefficients or the like of the linearization device 33, according to a specified training algorithm. This algorithm may be adaptive. One speaks of teaching to designate these operations.

It may be noted that for any modulation it is possible to find a signal sequence of determined length N whose characteristics satisfy imposed constraints in terms of spectral width, amplitude modulation depth, and/or others. In an example, N is equal to 10.

The AGC sequence comprises at least N symbols. It may therefore have a length greater than that of the training sequence, when it comprises more than N symbols. In this case, the symbols of the training sequence are preferably the symbols of the AGC sequence which are sent first. In this way, the convergence of the training algorithm and there the linearization of the RF amplifier are obtained the quickest.

Training phases may be performed periodically or in some other fashion. Other constraints may have to be taken into account after the initial training phase, when it is entirely suitable to correct drifting of the transmitter. The training sequence may therefore alter both in content and in length. The number N is therefore not necessarily fixed from one transmission of the training sequence to another. If an increase in the size of the sequence poses problems (for example if the frame structure is fairly inflexible), then the size N of the sequence can be fixed and just its content can be modified as a function of the alterations in the constraints on the system.

Figure 2:
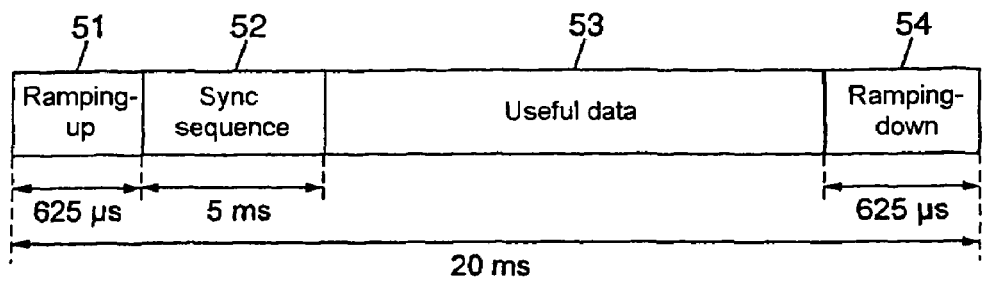
FIG. 2 is a diagram illustrating a first example of bursts transmitted by the mobile terminal, without AGC sequence.

The diagram of FIG. 2 illustrates a first exemplary burst, which does not comprise any AGC sequence. In this example, the burst has a duration equal to 20 ms. It comprises firstly a ramping-up 51 of 625 µs, comprising five padding symbols, to ensure the power rise. The expression padding symbols is understood to mean that the binary data sent in this ramping-up are padding bits, that is to say for example a string of 0s. It next comprises a sequence of synchronization data 52 whose duration is equal to around 5 ms. Next, it comprises a sequence of useful data 53. The useful data may be voice-coding data or more generally traffic data, or signaling data depending on whether the burst is transmitted on a traffic logical channel or on a signaling logical channel, respectively. It finally comprises a ramping-down 54, again having five padding symbols for the power drop. Optionally, a guard time is moreover envisaged after the transmission of a burst, so as to guarantee the return to reception of the transmitter.

Furthermore, in any frame structure provision is made to transmit isolated bursts, in particular at each change of logical channel (occurring in particular at each turn around, that is to say switchover from a receive phase to a transmit phase of the terminal), with each change of RF frequency (when a frequency jump functionality is implemented by the system), with each change of transmission power rating, or else in other particular cases that would take too long to detail here.

Figure 3:
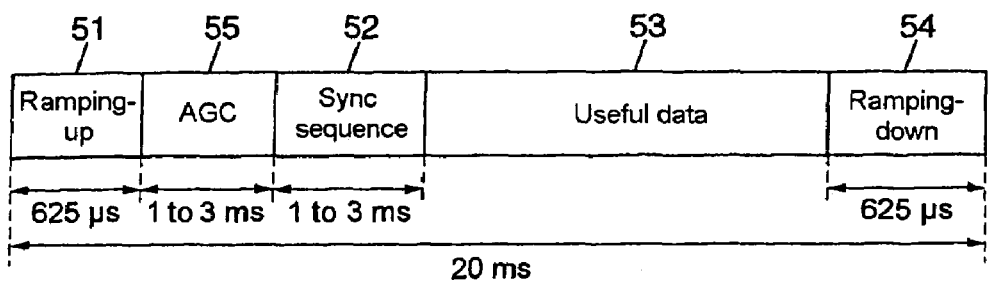
FIG. 3 is a diagram illustrating a second example of bursts transmitted by the mobile terminal, with an AGC sequence which according to the invention comprises a linearization training sequence.

FIG. 3 shows an example of an isolated frame such as this comprising, before the synchronization sequence 52, an AGC sequence referenced 55. This sequence 55 is transmitted so as to allow the dynamic control, by the fixed network, of the transmission power of the transmitter (see above). In this example, the sequence 52 and the sequence 55 each last only 1 to 3 ms. The other parts of the burst are unchanged with respect to the burst of FIG. 2. The sequence of useful data 53 may sometimes be shorter than in the case of a normal burst according to FIG. 2.

Part of these isolated bursts is used to allow the device 34 for training the radiofrequency transmitter 32 to execute an algorithm for training the linearization device 33. In the example of FIG. 3, the linearization sequence is thus included in the aforesaid AGC sequence.

It is thus possible to use the time required for the transmission of the training sequence for other ends such as for example the tuning of the AGC at reception, according to the method alluded to above in regard to the diagram of FIG. 1.

The AGC sequence, and thus the training sequence, are preferably transmitted at the start of a frame, and then upon a change of logical channel, upon a change of RF frequency and/or upon a change of power rating and/or in other cases that it would be too lengthy to detail here. This is why it is particularly advantageous to combine these sequences (the training sequence being included within the AGC sequence).

The AGC sequence is situated as near as possible to the signal power ramping-up, for example, just after this ramping. In this way, the training of the linearization device may be carried out as quickly as possible and thus disturb transmission for the least possible time.

It is preferable for the length of the training sequence to be such that it does not occupy too large a portion of the burst so as to keep a maximum of symbols for the broadcasting of useful information. This duration obviously depends on the sought-after accuracy of the training algorithm but a compromise between accuracy and duration often turns out to be necessary in order to preserve a maximum of useful information in the burst. A reasonable compromise is achieved when it represents around 5% of the total duration of the burst. In the case of a 20 ms burst transmitted at a binary rate of 8 ksymbols/s, the duration of a training sequence of N=10 symbols is thus equal to 1.25 ms, i.e. 6.25% of the total duration of the frame.

Figure 4:
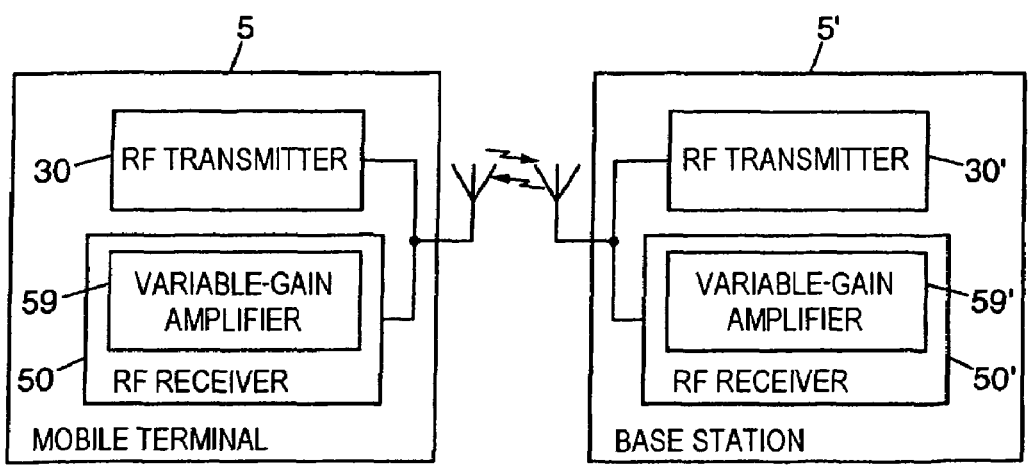
FIG. 4 is a diagram illustrating the implementation of an AGC method between a first and a second item of equipment, and vice versa.

The diagram of FIG. 4 illustrates the implementation of an AGC method (known per se) between a first item of equipment 5 and a second item of equipment 5' of a radiocommunication system.

The item of equipment 5 is here a mobile terminal for example such as described above in regard to FIG. 1. It comprises the RF transmitter 30 and the RF receiver 50, the latter comprising the variable-gain amplifier 59. The item of equipment 5' is here a base station with which the mobile terminal 5 communicates, which comprises an RF transmitter 30' and an RF receiver 50' having a variable-gain amplifier 59'. Operationally, the components 30', 50' and 59' of the base station 5' are identical or comparable to the components 30, 50 and 59 respectively of the mobile terminal 5'. These components are not detailed again here.

An AGC sequence transmitted by the mobile terminal 5 allows the dynamic control of the gain of the amplifier 59' of the receiver 50' of the base station 5'. Conversely, an AGC sequence transmitted by the base station 5' allows the dynamic control of the gain of the amplifier 59 of the receiver 50 of the mobile terminal.

The invention claimed is:

1. A method of training a device for linearizing a radiofrequency amplifier which is included within a radiofrequency transmitter of a first equipment of a radiocommunication system, which transmitter is adapted for transmitting bursts according to a determined frame structure, each burst comprising symbols belonging to a determined alphabet of symbols, the method comprising the steps consisting in:
   a) generating a linearization training sequence comprising a determined number N of symbols, where N is a determined integer;
   b) transmitting the linearization training sequence by means of the transmitter in at least certain of the bursts transmitted by the latter;
   c) comparing the linearization training sequence transmitted with the linearization training sequence generated so as to train said linearization device,
   wherein, in step b), the linearization training sequence is included in a sequence of symbols that is also further designed to allow the adjusting of at least one parameter of a radiofrequency receiver of a second equipment of the radiocommunication system with which said first item of equipment communicates.

2. The method of claim 1, wherein the sequence of symbols that is designed to allow the adjusting of at least one parameter of the radiofrequency receiver is a sequence of symbols that is designed to allow the dynamic control of the gain of a variable-gain amplifier of said radiofrequency receiver.

3. The method of claim 1, wherein the linearization training sequence occupies only a part of the burst in which it is transmitted.

4. The method of claim 3, wherein the linearization training sequence occupies around 5% of the duration of the burst in which it is transmitted.

5. The method of claim 1, wherein the linearization training sequence is transmitted at the start of the determined frame structure.

6. The method of claim 1, wherein the linearization training sequence is further transmitted during a change of logical channel, a change of frequency and/or a change of power rating of the first equipment.

7. The method of claim 1, wherein the sequence of symbols that is designed to allow the dynamic control of the transmission power of the first equipment comprises more than N symbols, and wherein said N symbols of the linearization training sequence are the symbols of the sequence of symbols that is designed to allow the dynamic control of the transmission power of the first equipment which are sent first.

8. A device for training a device for linearizing a radiofrequency amplifier which is included within a radiofrequency transmitter of a first equipment of a radiocommunication system, which transmitter is adapted for transmitting bursts according to a determined frame structure, each burst comprising symbols belonging to a determined alphabet of symbols, the device comprising:

a) means for generating a linearization training sequence comprising a determined number N of symbols, where N is a determined integer;

b) means for transmitting the linearization training sequence by means of the transmitter in at least certain of the bursts transmitted by the latter;

c) means for comparing the linearization training sequence transmitted with the linearization training sequence generated so as to train said linearization device, wherein said linearization training sequence is included in a sequence of symbols that is also further designed to allow the adjusting of at least one parameter of a radiofrequency receiver of a second equipment of the radiocommunication system with which said first item of equipment communicates.

9. The device of claim 8, wherein the sequence of symbols that is designed to allow the adjusting of at least one parameter of the radiofrequency receiver is a sequence of symbols that is designed to allow the dynamic control of the gain of a variable-gain amplifier of said radiofrequency receiver.

10. The device of claim 8, wherein the linearization, training sequence occupies only a part of the burst in which it is transmitted.

11. The device of claim 10, wherein the linearization training sequence occupies around 5% of the duration of the burst in which it is transmitted.

12. The device of claim 8, wherein the means for transmitting are adapted for transmitting the linearization training sequence at the start of the determined frame structure.

13. The device of claim 8, wherein the means for transmitting are adapted for transmitting, moreover, the linearization training sequence during a change of logical channel, a change of frequency and/or a change of power rating of the first equipment.

14. The device of claim 8, wherein the sequence of symbols that is designed to allow the adjusting of parameters comprises more than N symbols, and wherein said N symbols of the linearization training sequence are the symbols of the sequence of symbols that is designed to allow the adjusting of parameters which are sent first.

15. A mobile terminal of a radiocommunication system, comprising a radiofrequency transmitter having a radiofrequency amplifier and a device for linearizing the radiofrequency amplifier, further comprising a device for training the linearization device as claimed in any one of claims 8.

16. A base station of a radiocommunication system comprising a radiofrequency transmitter having a radiofrequency amplifier and a device for linearizing the radiofrequency amplifier, further comprising a device for training the linearization device as claimed in any one of claims 8.

* * * * *

UNITED STATES PATENT AND TRADEMARK OFFICE
CERTIFICATE OF CORRECTION

PATENT NO.         : 7,680,209 B2
APPLICATION NO.    : 10/533861
DATED              : March 16, 2010
INVENTOR(S)        : Sandrine Touchais et al.

It is certified that error appears in the above-identified patent and that said Letters Patent is hereby corrected as shown below:

Title page 1 the Assignee's name 'EADS Telecom' should read --EADS Secure Networks--.

Signed and Sealed this
Thirty-first Day of May, 2011

David J. Kappos
*Director of the United States Patent and Trademark Office*